United States Patent [19]

Karetsos et al.

[11] Patent Number: 5,036,487
[45] Date of Patent: Jul. 30, 1991

[54] CMOS-RAM MEMORY IN A GATE ARRAY ARRANGEMENT

[75] Inventors: Anastasios Karetsos, Grobenzell; Gerhard Zwilling, Munich, both of Fed. Rep. of Germany

[73] Assignee: Siemens Aktiengesellschaft, Munich, Fed. Rep. of Germany

[21] Appl. No.: 449,839

[22] PCT Filed: Mar. 25, 1988

[86] PCT No.: PCT/DE88/00195
§ 371 Date: Nov. 6, 1989
§ 102(e) Date: Nov. 6, 1989

[87] PCT Pub. No.: WO88/09037
PCT Pub. Date: Nov. 17, 1988

[30] Foreign Application Priority Data

May 4, 1987 [DE] Fed. Rep. of Germany ....... 3714813

[51] Int. Cl.[5] .......................... G11C 5/02; G11C 5/06
[52] U.S. Cl. ...................................... 365/51; 365/156; 365/181
[58] Field of Search .................. 365/51, 63, 154, 181, 365/230.03, 230.06, 156, 174, 190; 307/290

[56] References Cited

U.S. PATENT DOCUMENTS 4,112,506 9/1978 Zibu ..................................... 365/181
4,554,646 11/1985 Yoshimoto et al. ............. 365/230.03

FOREIGN PATENT DOCUMENTS 3206507 10/1982 Fed. Rep. of Germany.
2159359A 11/1985 United Kingdom.

OTHER PUBLICATIONS

"A 240K Transistor CMOS Array with Flexible Allocation of Memory and Channels", IEEE Journal of Solid-State Circuits, vol. SC-20, No. 5, Oct. 1985, Hiromasa Takahashi et al., pp. 1012-1017.
"A 256K CMOS SRAM with Variable Impedance Data-Line Loads", IEEE Journal of Solid-State Circuits, vol. SC-20, No. 5, Oct. 1985, Sho Yamamoto et al., pp. 924-928.

Primary Examiner—James W. Moffitt
Assistant Examiner—Jack A. Lane
Attorney, Agent, or Firm—Hill, Van Santen, Steadman & Simpson

[57] ABSTRACT

A CMOS-RAM memory is composed of at least one main memory area SF whose memory cells are realized with a seven transistor basic cell (SC) in a gate array arrangement. The memory cells are thereby arranged in a matrix in the main memory area. A word line decoder (WD) lies at one side of the main memory area (SF) of the gate array arrangement in row direction, this word line decoder (WD) containing - per row of memory cells-a decoder sub-circuit (WDT) realized with basic cells for generating a word line signal from address signals. A drive circuit (AST) is arranged between the word line decoder (WD) and the main memory area (SF), the drive circuit (AST) providing - per row of memory cells - a drive sub-circuit (ASTT) for generating a write signal in inverted and non-inverted form from the word line signal and from a selection signal with which the memory cells of a row of memory cells are driven. The write/read circuits realized in basic cells are arranged at another side of the main memory area, the information being capable of being written into the main memory area or, respectively, information being capable of being read out of the main memory area via these write/read circuits. The RAM memory has the advantage that the capacity of the memory on the gate array arrangement can be adapted to the requirements without difficulty.

6 Claims, 10 Drawing Sheets

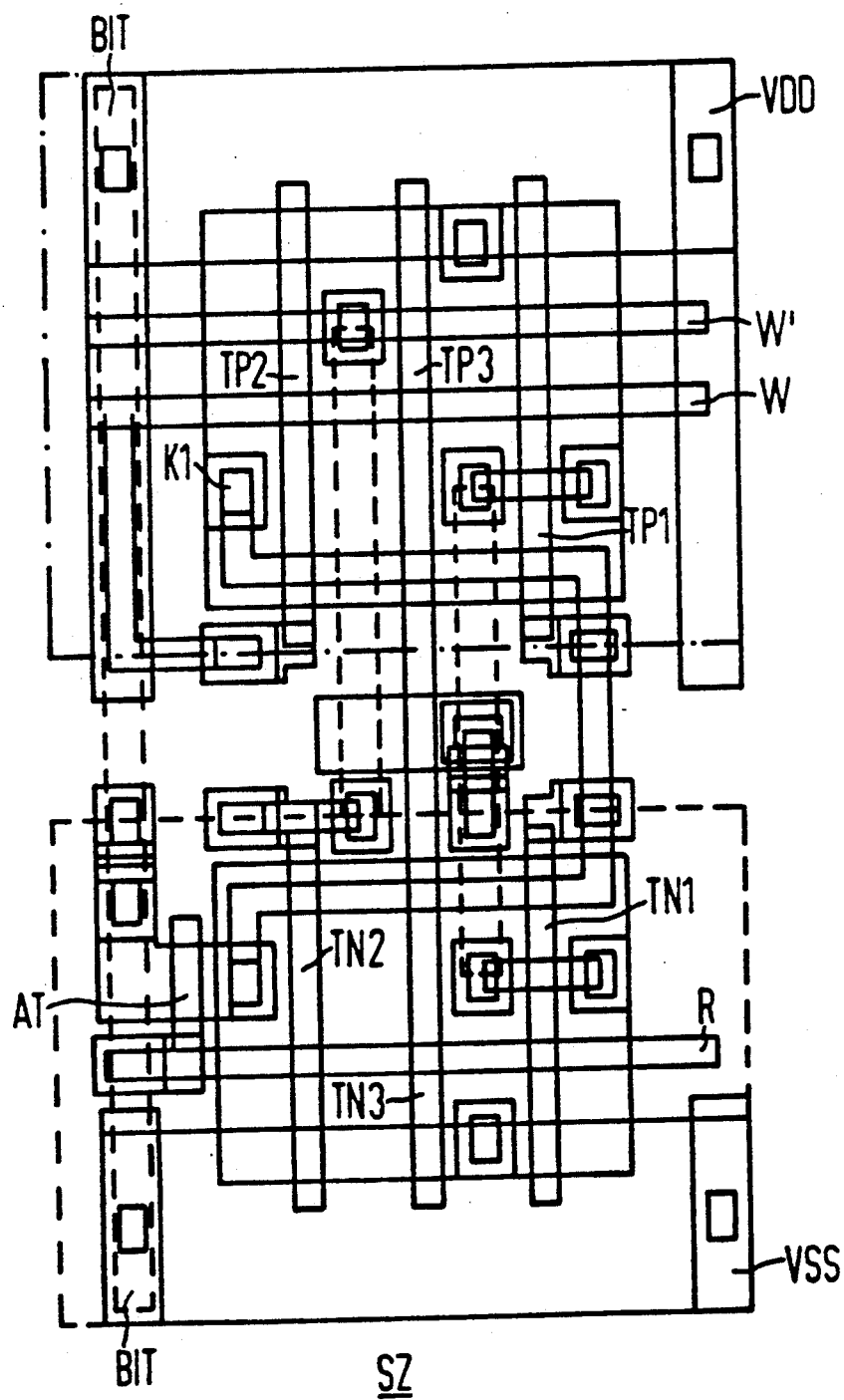

CMOS-RAM MEMORY IN A GATE ARRAY ARRANGEMENT

BACKGROUND OF THE INVENTION

The invention is directed to a CMOS-RAM memory in a gate array arrangement composed of seven transistor basic cells wherein a memory cell can be realized with a basic cell.

Gate array arrangements are known (for example, Hitachi Review, Vol. 33 (1984) No. 5, Pages 261-266). In such gate array arrangements, regions are provided on a chip in a specific arrangement in which basic cells are realized. The basic cells are composed of n-channel and p-channel transistors that are arranged in the regions in a specific way. A basic cell can be tailored for realizing a basic function by connecting the n-channel and p-channel transistors per basic cell and, for example, it can be given a logical function or a storing function. It derives from Hitachi Review that was cited above that a basic cell can be composed of, for example, ten transistors that are connected such to one another such that a RAM memory cell having an input or two inputs arises. For example, a logic function, for example, a NAND function, can be realized by other connections of the transistors in a basic cell.

The realization of memories having different capacities was heretofore achieved in various ways. Bistable circuits were employed for low-capacity storing structures. These were composed of a plurality of gates and therefore require a relatively great number of basic cells of a gate array for storing an informational unit. High-capacity memories were realized in that a memory block having a defined capacity and designed as a general cell was integrated in the core region of the chip. As a result the capacity of a memory can only be selected in steps of the memory capacity of this general cell. The area reserved for the general cells can thus only be used for the memory, and not for other logical functions.

SUMMARY OF THE INVENTION

The object underlying the invention is comprised in reciting a RAM memory whose memory cells are composed of seven transistor basic cells and whose size can be arbitrarily adapted to customer demands.

The foregoing object is achieved by providing a CMOS-RAM memory on a gate array arrangement composed of seven transistor basic cells wherein one memory cell can be realized with one basic cell, comprising:

at least one main memory area composed of basic cells arranged in a matrix;

a word line decoder arranged at one side of rows of the main memory area, the word line decoder containing, per row of memory cells, a decoder sub-circuit realized with basic cells for generating a word line signal from a part of an address signals;

a drive circuit arranged between the word line decoder and the main memory area, the drive circuit providing, per row of memory cells, a drive sub-circuit realized with a basic cells for generating a write signal in inverted and non-inverted forms from the word line signal and a selection signal; and read/write circuits realized in basic cells arranged adjacent to the main memory area at a different side thereof at a column end.

Thus, only one basic cell is used for realizing one or more main memory areas for every memory cell. The circuits required for selection, for reading and writing information are then arranged around the main memory areas. These circuits are likewise realized exclusively with the assistance of the basic cells. When a main memory area is to be added or when a main memory area is to be enlarged, then this is possible in a simple way. Additional basic cells merely have to be provided for the memory cells, these being either arranged in a previous main memory area or an entire main memory area attached next to the previous main memory area. The position of the circuits required for the drive and selection of the memory cells, these circuits being grouped around the main memory areas, is thereby hardly affected. Moreover, the possible memory configurations can be freely selected. When the maximum memory capacity amounts, for example, to 16K, then the possible memory configuration can amount to either 512 words times 32 bits through 4096 words times 4 bits. It is expedient to select the word width equal to or greater than 4 bits, whereby the word width can be expanded in steps of 1 bit.

The invention is set forth in greater detail in the following detailed description of the presently preferred embodiments with reference to exemplary embodiments that are shown in the accompanying drawings.

BRIEF DESCRIPTION OF THE DRAWINGS

FIG. 10 The layout of a memory cell;

DETAIL DESCRIPTION OF THE PRESENTLY PREFERRED EMBODIMENT

Figure 1:
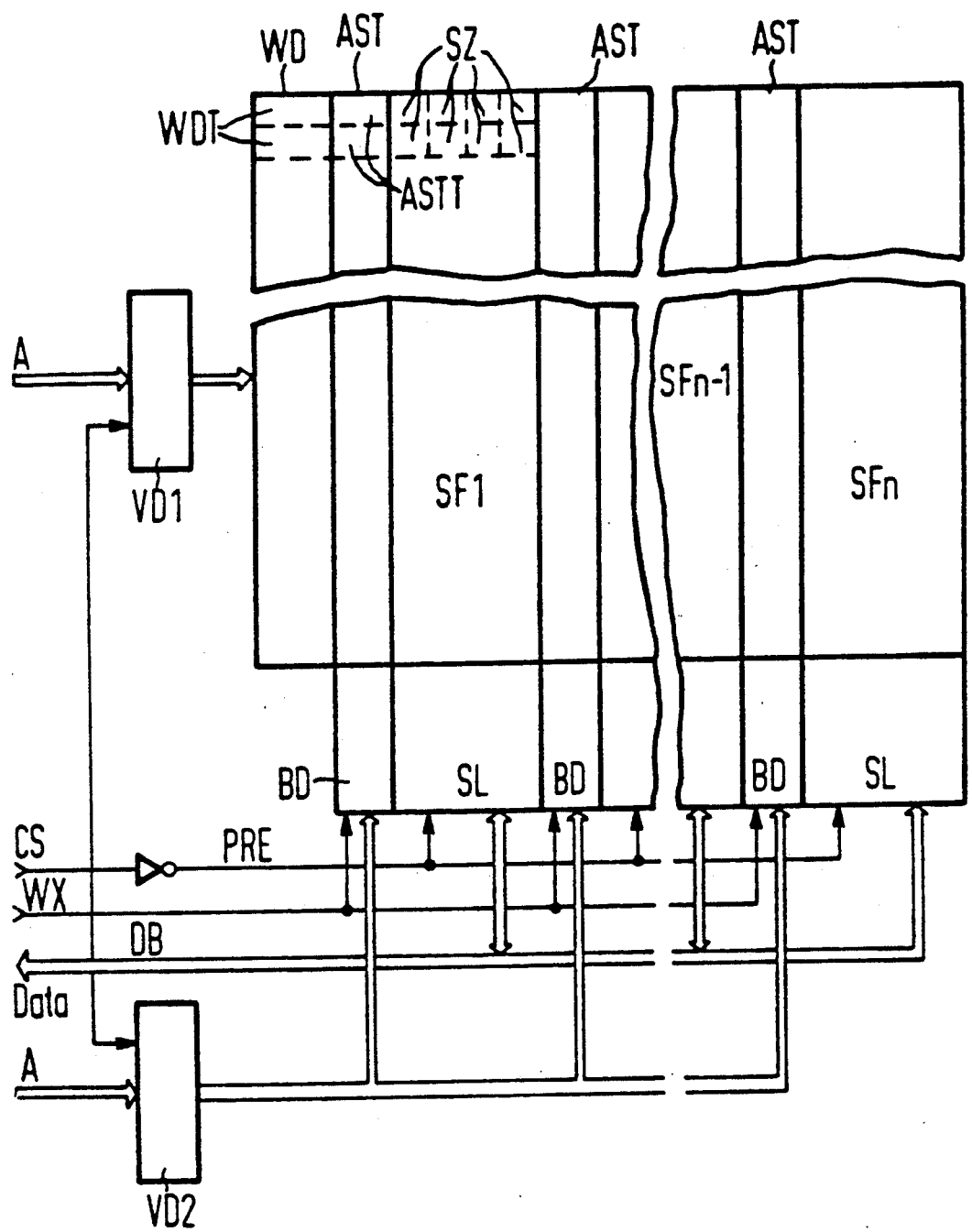
FIG. 1 A schematic illustration of a RAM memory.

According to FIG. 1, a plurality of main memory areas SF1 through SFn are arranged next to one another, each of these containing memory cells in lines and columns, i.e. matrix-like. For example, a main memory area can be composed of m rows (m=4 ... 64) of $n \times K$ columns (n=. . . 64, $4 \leq K \leq 32$) ($n \times K \leq 256$), whereby K represents the data word width in bits. The capacity of the memory can thus be increased by varying the plurality of rows; an increase in the capacity is also possible when additional main memory areas SF are provided.

A drive circuit AST is provided adjacent to every main memory area SF, namely, as seen in row direction, this drive circuit AST generating write signals when information is to be written into the main memory area. To that end, it receives a word line signal from a word line decoder WD on the basis whereof a specific word line of the memory (row) is selected and, given a plurality of main memory areas, receives a selection signal from a block decoder BD for the selection of a specific main memory area SF. The word line decoder WD is provided only once per memory; a plurality of main memory areas can be allocated to it. The selection of a specific main memory area SF then ensues via the block decoder BD.

The word line decoder WD is supplied with address signal A via a pre-decoder VD1, these address signals A enabling the word line decoder WD to select the word line of that row into which information is to be written.

The individual main memory areas SF are selected by the block decoder BD which is likewise supplied with address signals A for this purpose that had been conducted via a predecoder VD2.

As seen in column direction, the write/read amplifier circuits SL that are connected to a data bus DB lie next to the main memory areas SF. Information that is to be written into the main memory areas can be supplied to the main memory areas SF via this data bus or information read out of the main memory areas can be output via this data bus. A determination is made with the assistance of a write selection signal WX whether information is to be written into the memory or information is to be read out of the memory. The main memory area is selected from address signals in the block decoder BD and a selection signal for writing or, respectively, a selection signal for reading is generated.

Finally, a chip selection signal CS is also provided in order to activate/inactivate the memory.

Figure 2:
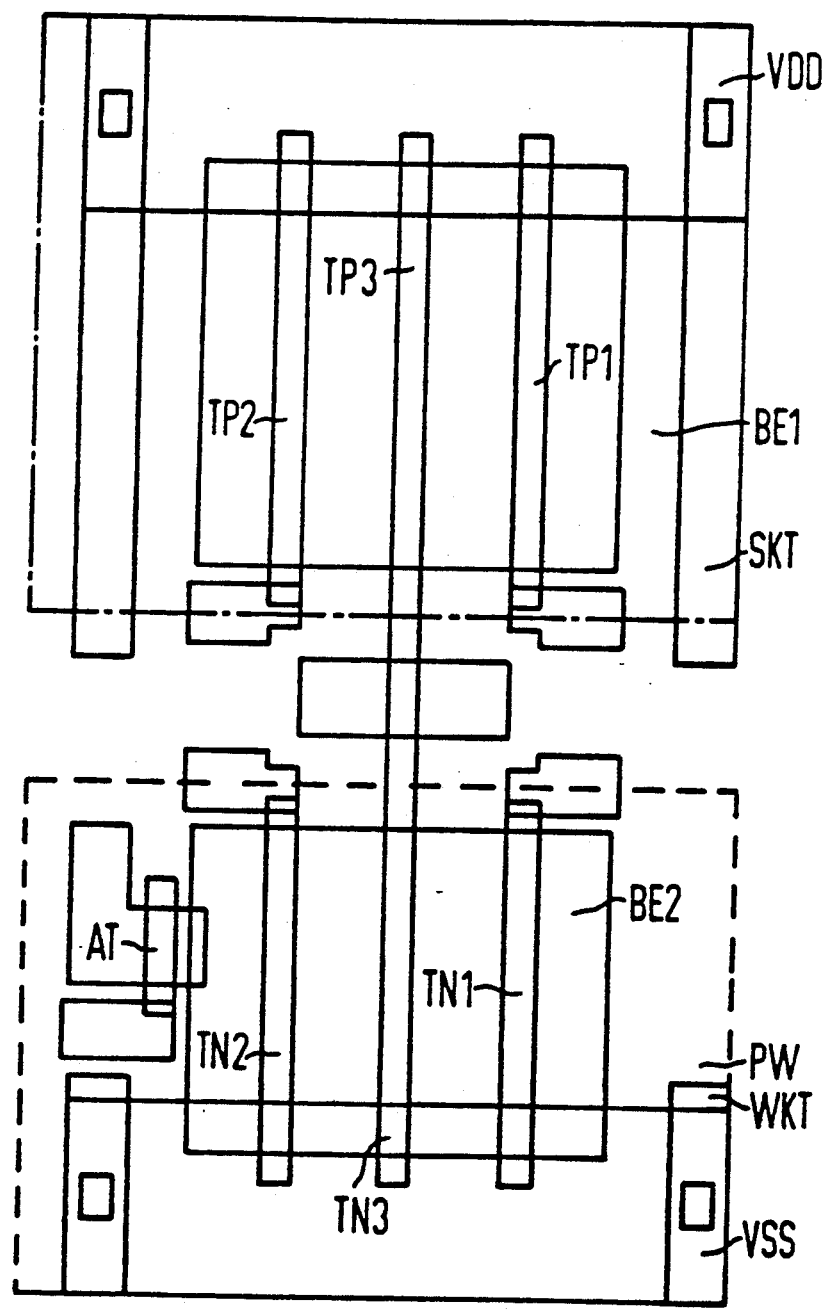
FIG. 2 The layout of a basic cell.

The main memory areas SF, the drive circuits AST, the word line decoder WD, the block decoder BD and the write/read amplifier circuits SL are realized with the assistance of a basic cell G2 whose layout is shown in FIG. 2. The basic cell contains three p-channel transistors TP1, TP2, TP3 and three n-channel transistors TN1, TN2, TN3 that have the same channel width and whose gate terminals lie between two regions BE1, BE2 for the p-channel transistors and the n-channel transistors. The fourth n-channel transistor AT that has a smaller channel width than the remaining n-channel transistors TN also lies adjacent to the n-channel transistors TN1 through TN3. The basic cell is terminated at both sides with a line for the supply voltages, namely, for the supply voltage VDD at the side of the p-channel transistors TP and for the supply voltage VSS at the side of the n-channel transistors TN. It must also be pointed out that the n-channel transistors TN lie in a p-well PW that is connected to the supply voltage VSS via a well contact WKT. Substrate contacts SKT that are connected to the supply voltage VDD are arranged next to the region for the p-channel transistors TP.

Figure 3:
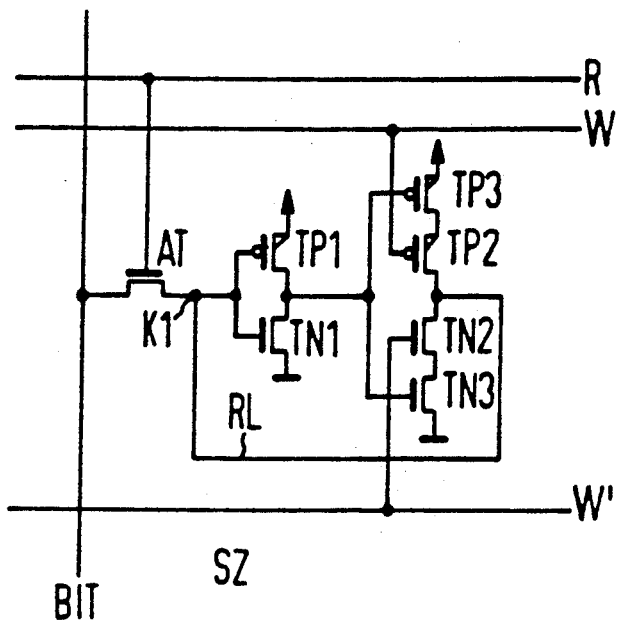
FIG. 3 The wiring diagram of a memory cell.

A memory cell SZ according to FIG. 3 can then be realized with the assistance of such a seven transistor basic cell. This memory cell SZ is composed of a selection transistor AT and of two feedback converters. The one inverter is realized with the assistance of the transistors TP1 and TN1; the other inverter is realized with the assistance of the transistors TP2, TP3 and TN2 and TN3. The selection transistor AT is additionally connected to a bit line BIT, its gate electrode is connected to a line for the word line signal R, the gate electrode of the transistor TP2 of the second inverter is connected to the write signal W, the gate electrode of the corresponding transistor TN2 is connected to the inverted write signal W'.

Since the transistor widths are established relatively large in gate arrays, the feedback line RL for writing the cell must be switchable to high-impedance. The selection transistor AT may thereby have only a limited width in order to prevent an unintentional triggering of the cell when reading (fast through-connection of the selection transistor AT leads to a recharging of the bit line BIT to the input nodes K1 of the cell).

The function of the memory cells of FIG. 3 shall be set forth in brief. When information is to be read out of the memory cell, then the word line signal R is supplied to the memory cell and, thus, the selection transistor AT is activated. Since the write signals W='0' and W'='1' are adjacent, the transistors TP2 and TN2 are through-connected, as a result whereof a change of the status of the memory cell is not possible. The result is that the bit line BIT recharges to the potential at the node K1. When information is to be written into the memory cell, then the transistors TP2, TN2 are inhibited by the write signals W='1', W'='0'. The selection transistor AT is activated, as a result whereof the node K1 is recharged to bit line potential. When the write signal changes to W='0', W'='1', then the transistors TP2, TN2 change into the conductive condition and the potential at K1 is actively maintained by the memory cell. Subsequently, the word line signal R can again be turned off and the selection transistor AT changes into the inhibited condition.

FIG. 10 shows the layout of a memory cell of FIG. 3. The individual transistors are identified in accord with FIG. 3; the individual lines are identified with the signal that is carried on these lines. It may be easily seen from FIG. 10 how the individual transistors are connected to one another and to the lines for the signals. Accordingly, there is no need for further explanation of FIG. 10.

Figure 4:
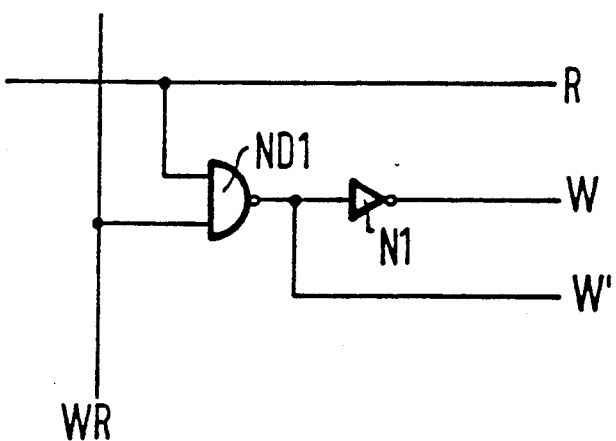
FIG. 4 A drive circuit for generating write signals.

A portion of a drive circuit AST derives from FIG. 4. A drive sub-circuit ASTT that is shown in FIG. 4 is provided therein per row of memory cells of a main memory area SF. This drive sub-circuit ASTT is composed of a first NAND element ND1 that is supplied with the word line signal R and a selection signal WR from the block decoder BD. The NAND element ND1 is connected to an inverter IV1 at whose output the write signal W and at whose input the inverted write signal W' are output.

Figure 11:
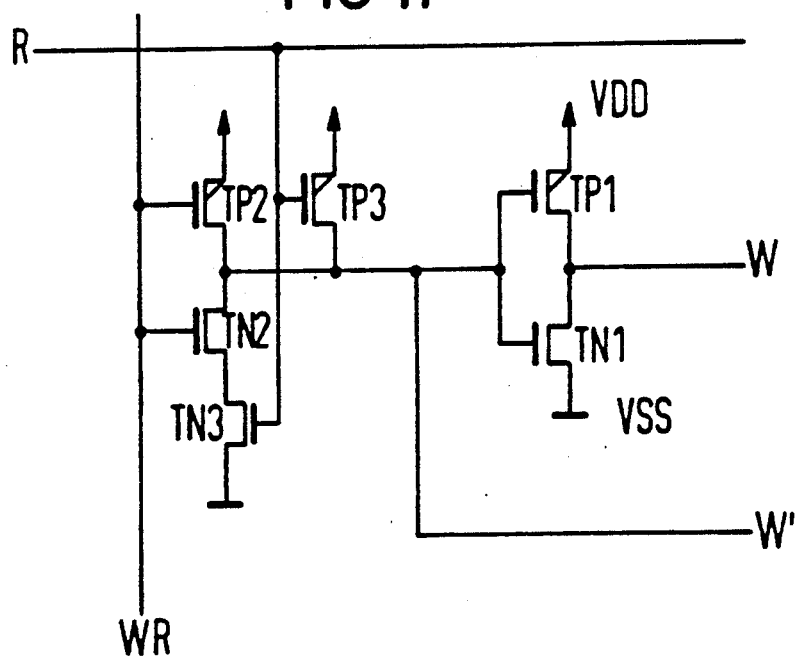
FIG. 11 The wiring diagram of a drive circuit of FIG. 4.
Figure 12:
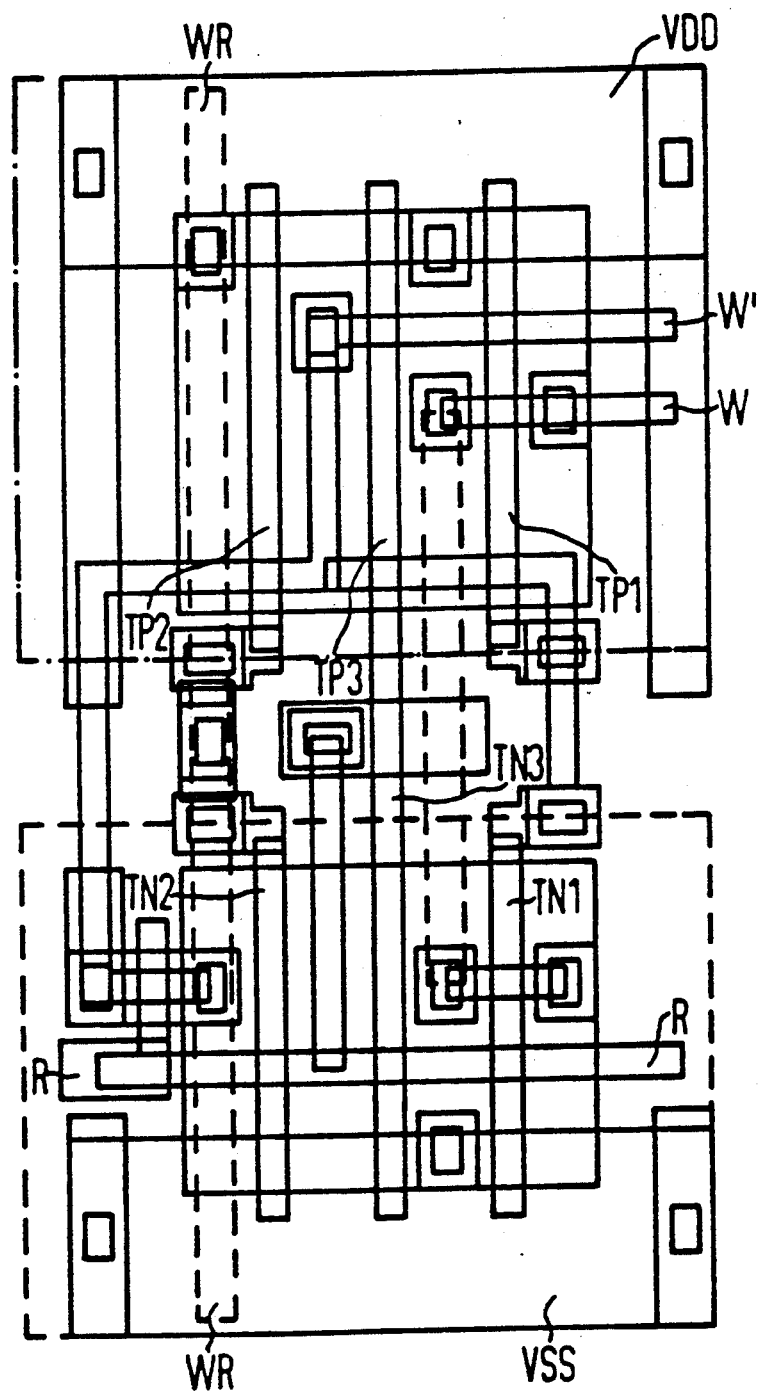
FIG. 12 The layout of the drive circuit.

Every drive sub-circuit of FIG. 4 can be realized with the assistance of a basic cell as shown in FIG. 12. For illustration, the wiring diagram of the NAND element ND1 and of the inverter IV1 is shown in FIG. 11. The transistors recited here then appear again in the layout of FIG. 12. The individual lines are again referenced with the signal that they carry. Here, too, the layout of the drive sub-circuit of FIG. 12 can be easily traced on the basis of the wiring diagram of FIG. 11. The individual transistors are identified in accord with FIG. 2.

Figure 5:
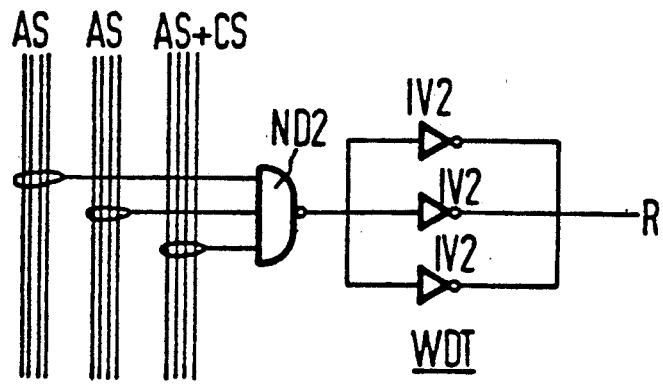
FIG. 5 A word line decoder for generating word line signals.

The word line decoder WD that is provided only once for all main memory areas SF contains a decoder sub-circuit WDT as shown in FIG. 5 per row of memory cells. This decoder subcircuit uses address signals AS to define the word line into which an information is to be written or from which an information is to be read. It is composed of a NAND element ND2 that is connected to lines for the address signals AS and is composed of inverters IV2 that are connected to the output of the NAND element ND2. The inverters IV2 are connected in parallel and output the word line signal R at the output.

Figure 13:
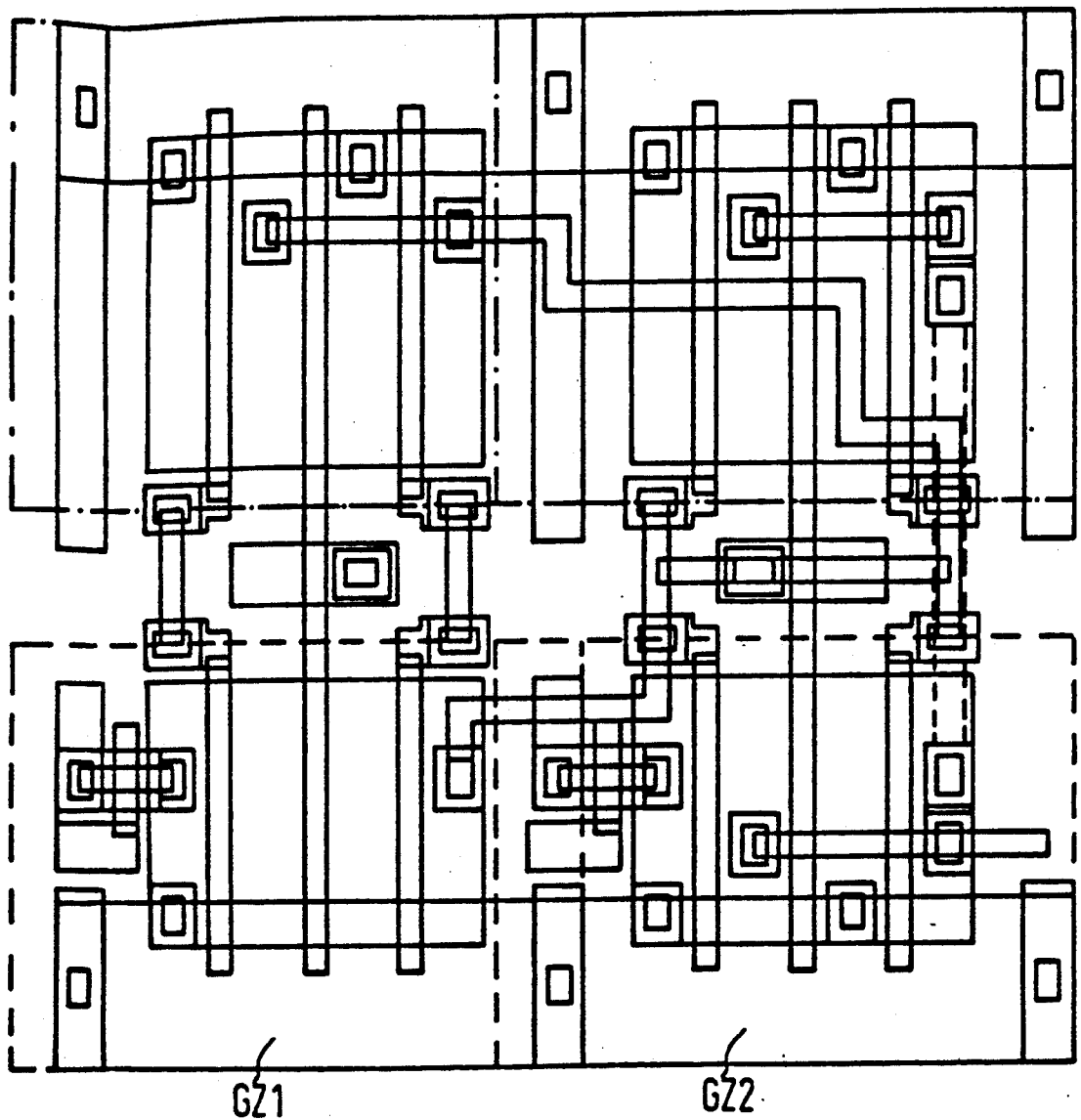
FIG. 13 A layout of the word line decoder.

Such a decoder sub-circuit can be realized with the assistance of two basic cells, as shown in FIG. 13. The first basic cell GZ1 realizes the three-fold NAND element ND2, the basic cell GZ2 lying adjacent thereto realizes an inverter IV2 three times. The current path is not shown herein; however, it can be developed without difficulties from the decoder subcircuit of FIG. 5.

Figure 6:
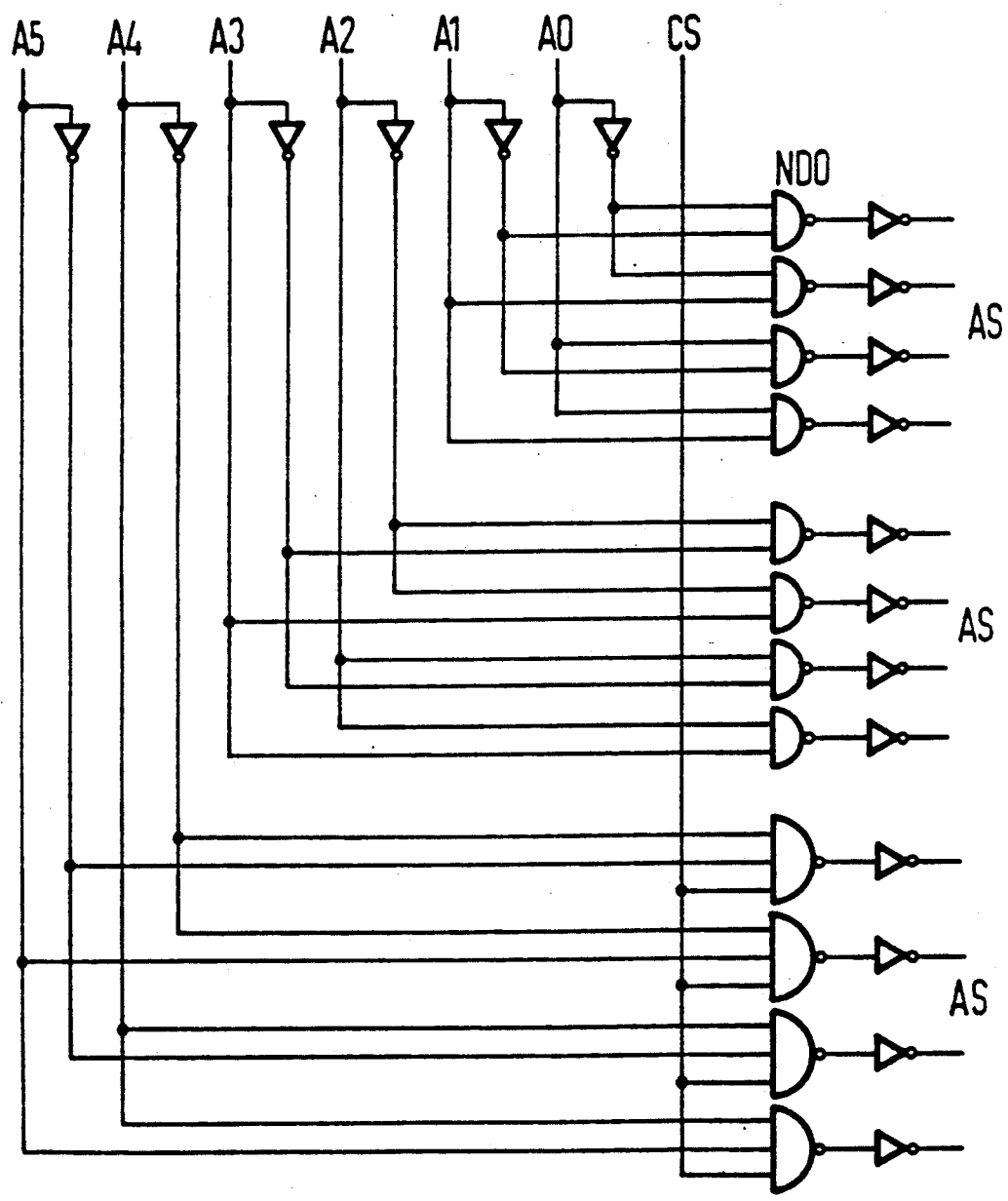
FIG. 6 A pre-decoder that generates intermediate address signals for the word line decoder from a part of the address signals.

The address signals AS that are supplied to the decoder sub-circuits WDT are taken from a part of the address A by a pre-decoder VD1. FIG. 6 shows a circuit diagram of such a pre-decoder VD. Six places of an address A0 through A5 and the chip selection signal CS are supplied to the pre-decoder. From this address, the pre-decoder VD generates the address signals AS for the word line decoder WD in a standard way. To that end, the addresses are supplied inverted and non-inverted to NAND elements and ND0 that are connected either to two address inputs or to two address inputs and the line for the chip selection signal CS. A pre-decoding of the address A ensues in this fashion; a second, further decoding ensues with the assistance of the word line decoder WD.

Figure 7:
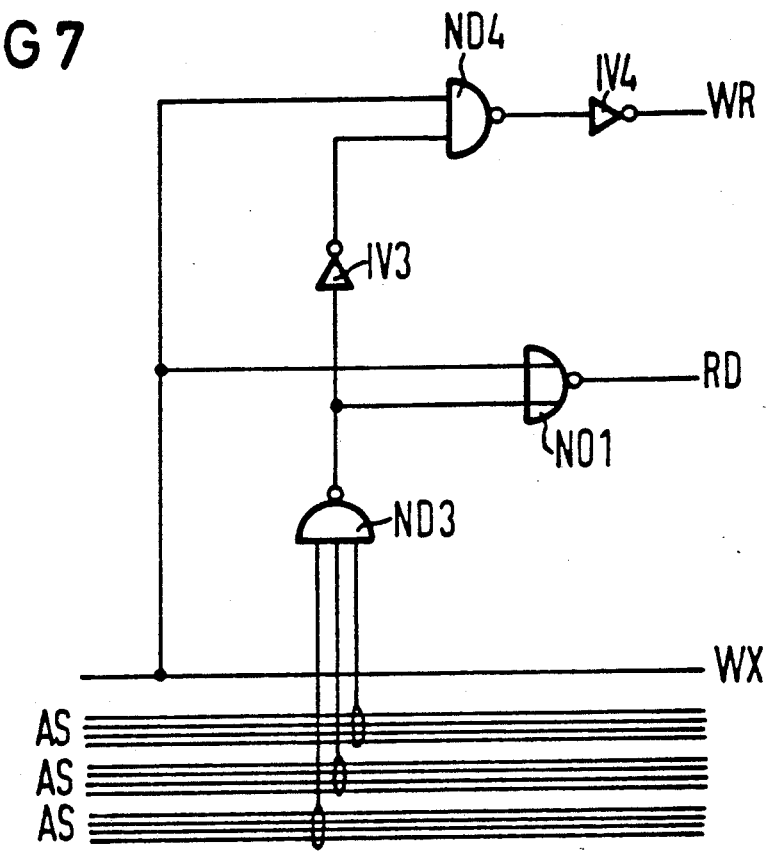
FIG. 7 A block decoder for the selection of a main memory area.

When a memory contains a plurality of main memory areas, then a block decoder BD with whose assistance the individual main memory area SF is selected upon employment of a second part of the address A must be provided per memory main area SF. Such a block decoder is shown in FIG. 7. It is composed of an NAND element ND3 that is connected to the address signals AS, of an NOR element NO1 that is connected to the output of the NAND element ND3 and to the line for the write selection signal WX and outputs the read signal RD at the output, and is composed of a further NAND element ND4 that is connected via an inverter IV3 to the output of the NAND element ND3 and to the line for the write selection signal WX and outputs the selection signal WR at the output after inversion via an inverter IV4. The illustrated block decoder obtains its address signals AS via the pre-decoder VD2 that is constructed in accord with FIG. 6. It can be realized with the assistance of four basic cells GZ.

Figure 8:
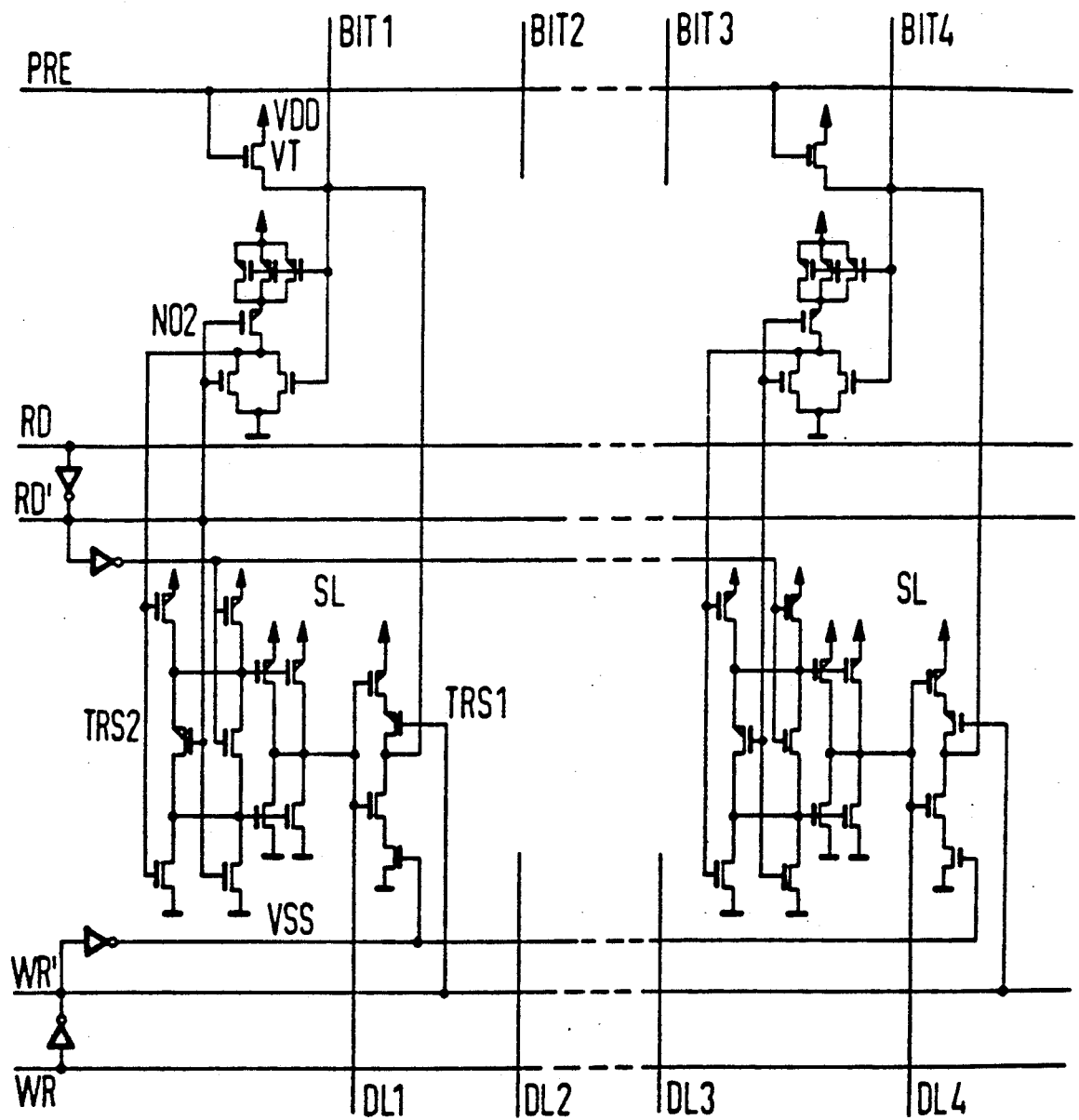
FIG. 8 A schematic illustration of the arrangement of write/read circuits.
Figure 9:
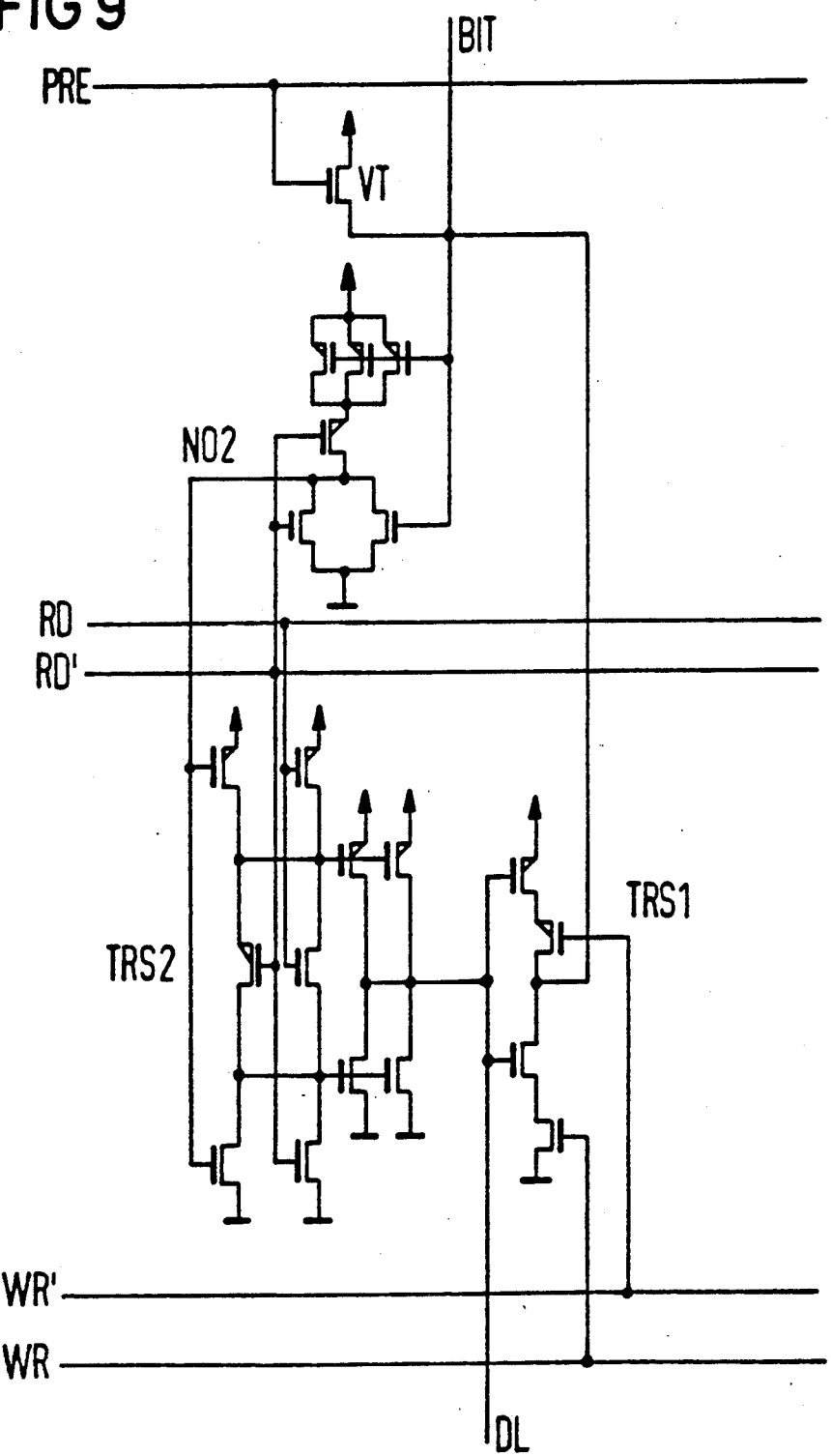
FIG. 9 A wiring diagram of a write/read circuit.

The write/read circuit for four bits is shown in FIG. 8. One write/read circuit SL via which the information are transmitted from a data line DL to the bit line BIT is needed per bit line. The write/read circuits SL are supplied with a pre-charging signal PRE. Further, they are supplied with the selection signal WR and the read signal RD. The write/read circuit for four bits can be realized with 4×4 basic cells GZ (including the inverters for RD', RD, WR'). The write/read circuit without inverter for the selection signal WR' and the read signal RD' can be realized with four basic cells GZ. RD' and WR' must then be supplied (FIG. 9).

For writing, information are supplied from the data bus DB to a tristate driver TRS1 via a data line DL. This tristate driver is composed of two p-channel transistors and of two n-channel transistors. Dependent on the information on the data line DL, either the potential H or the potential L is applied to the line BIT. To that end, the selection signal WR='1' must be adjacent.

When reading, the bit line is first pre-charged via the pre-charging transistor VT in order to proceed from a defined condition at the beginning of the read event. The evaluation of the bit line potential is assumed by a NOR element NO2 to which the inverted read signal RD' is also supplied. The NOR element NO2 is inhibited with the assistance of the inverted read signal RD' when no information is to be read out. The switching threshold of the NOR element NO2 is shifted toward the potential VDD by the parallel connection of a plurality of p-channel transistors in order to quickly recognize a discharge of the bit line BIT and, thus, to reduce the access time.

The NOR element NO2 is followed by a tristate driver TRS2. This applies a potential corresponding to the potential on the bit line to the data line DL. To that end, the tristate driver TRS2 is supplied with the read signal RD. The function of the write/read circuit can be derived without difficulty from the wiring diagram of FIG. 9.

We claim:

1. A CMOS-RAM memory in a gate array arrangement, comprising:
   (a) basic cells, each basic cell comprising an operative arrangement of seven transistors;
   (b) at least one main memory area comprising a matrix of memory cells arranged in rows and columns, each row containing at least one word selectable by an inverted and non-inverted write signal, each memory cell constructed of an operative arrangement of a basic cell;
   (c) a word line adjacent each row and connected to the memory cells of said row;
   (d) a drive circuit disposed adjacent to one of said at least one main memory area at one end of the rows thereof, said drive circuit comprising drive sub-circuits, one drive sub-circuit being allocated per row and operative to generate a write signal for its respective row in accordance with a word line signal and a selection signal, each drive sub-circuit comprising at least one basic cell;
   (e) a word line decoder disposed adjacent said drive circuit such that said drive circuit is disposed between said one of said at least one main memory area and said word line decoder, said word line decoder comprising a decoder sub-circuit per row of memory cells, each decoder sub-circuit being operative to generate a word line signal from an address signal, said word line signal being supplied to its associated word line;
   (f) a block decoder disposed at one columnar end of said drive circuit and operative to generate said selection signal and a read signal from an address signal for said at least one main memory area; and
   (g) a read/write circuit disposed adjacent one columnar end of said at least one main memory area and adjacent said block decoder, said read/write circuit being selectable by said read signal and comprised of said basic cells.

2. The CMOS-RAM memory according to claim 1, wherein the drive sub-circuit comprises a first NAND element to which the word line signal and the selection signal are supplied and an inverter that is connected to the output of the NAND element at whose input the inverted write signal is output and at whose output the non-inverted write signal is output.

3. The CMOS-RAM memory according to claim 2, wherein said word line decoder having decoder sub-circuits constructed of two basic cells is composed of a NAND element to which the address signals are supplied and of at least one inverter element that is connected to the output of the NAND element and that outputs the word line signal.

4. The CMOS-RAM memory according to claim 1, wherein said block decoder constructed of four basic cells lying in column direction and composed of: (1) a NAND element to which address signals are supplied, (2) a NOR element that is connected to the output of the NAND element and to which a write selection signal is supplied and that outputs the read signal, and (3) a further NAND element that is connected via an inverter to the output of the NAND element and to which the write selection signal is supplied and that outputs the selection signal via an inverter element.

5. The CMOS-RAM memory according to claim 1, wherein said write/read circuit is constructed of four basic cells arranged in column direction and comprises:
   a tristate driver arranged between a data line and a bit line respectively comprised of two n-channel and p-channel transistors lying in series to which the selection signal is supplied inverted and non-inverted;
   a NOR element connected to the bit line to whose other input the read signal is supplied in inverted form; and
   a tristate driver following the NOR element that transmits the read signal onto the data line.

6. The CMOS-RAM memory of claim 1, comprising a plurality of main memory areas, one driver circuit being provided per main memory area, one block decoder being provided per main memory area, one read/write circuit being provided per each main memory area, and one word line decoder being provided for all main memory areas.

* * * * *